(12) United States Patent
Tseng et al.

(10) Patent No.: US 9,506,960 B2
(45) Date of Patent: Nov. 29, 2016

(54) SMART METER WITH WIRELESS TRANSMISSION CAPABILITY

(71) Applicant: Wistron NeWeb Corporation, Hsinchu (TW)

(72) Inventors: Jiun-Kai Tseng, Hsinchu (TW); Ching-Chih Chien, Hsinchu (TW); Chia-Hong Lin, Hsinchu (TW); Guo-Cheng Tsai, Hsinchu (TW)

(73) Assignee: Wistron NeWeb Corporation, Hsinchu (TW)

( * ) Notice: Subject to any disclaimer, the term of this patent is extended or adjusted under 35 U.S.C. 154(b) by 197 days.

(21) Appl. No.: 14/280,693

(22) Filed: May 19, 2014

(65) Prior Publication Data

US 2015/0263409 A1 Sep. 17, 2015

(30) Foreign Application Priority Data

Mar. 17, 2014 (TW) .............................. 103109951 A

(51) Int. Cl.
*H01Q 1/24* (2006.01)
*G01R 21/00* (2006.01)
*H01Q 1/27* (2006.01)
*H01Q 5/307* (2015.01)
*H01Q 5/40* (2015.01)

(52) U.S. Cl.
CPC .............. *G01R 21/00* (2013.01); *H01Q 1/273* (2013.01); *H01Q 5/307* (2015.01); *H01Q 5/40* (2015.01)

(58) Field of Classification Search
CPC ...... H01Q 1/243; H01Q 1/38; H01Q 9/0421; H01Q 1/42
USPC ........................................ 343/702, 872, 856
See application file for complete search history.

(56) References Cited

U.S. PATENT DOCUMENTS

| 6,956,529 | B1* | 10/2005 | Chen | ......................... H01Q 1/38 343/700 MS |
| 7,692,600 | B1 | 4/2010 | Pakosz | |
| 8,228,209 | B2 | 7/2012 | Smith | |
| 2005/0052328 | A1 | 3/2005 | De Angelis | |
| 2010/0253538 | A1* | 10/2010 | Smith | ..................... G01D 4/002 340/870.02 |
| 2012/0098710 | A1* | 4/2012 | Seal | ......................... H01Q 9/16 343/702 |
| 2013/0120202 | A1* | 5/2013 | Lever | ....................... H01Q 3/04 343/766 |

FOREIGN PATENT DOCUMENTS

TW 201251519 A1 12/2012
TW 201332209 A1 8/2013

* cited by examiner

*Primary Examiner* — Dameon E Levi
*Assistant Examiner* — Collin Dawkins
(74) *Attorney, Agent, or Firm* — Winston Hsu; Scott Margo

(57) ABSTRACT

A smart meter capable of performing wireless transmission is used to show some power information, in which the smart meter includes an inner cylindrical case, a ring layer, an inner-layer antenna, and an outer-layer antenna. The interior of the inner cylindrical case is hollow. The ring layer surrounds the inner cylindrical case. The inner-layer antenna is attached to the ring layer and slides on the ring layer. The outer-layer antenna is also attached to the ring layer and overlaps as well as contacts with the inner-layer antenna. The inner-layer antenna and the outer-layer antenna are driven to adjust a total length of them in order to receive signals of different frequency bands.

7 Claims, 4 Drawing Sheets

SMART METER WITH WIRELESS TRANSMISSION CAPABILITY

BACKGROUND OF THE INVENTION

1. Field of the Invention

The present invention relates to a smart meter, and more particularly, to a smart meter with wireless transmission capability.

2. Description of the Prior Art

A traditional electric meter is usually installed at the first floor of a residential building, for measuring an amount of electricity consumed by residents. The electric meter also provides related power consumption information, e.g., an amount of consumed energy in kilowatt-hours, to a power company or the residents for reference. The power consumption information needs to be transcribed by staffs of the power company, which may lead to man-made errors. Meanwhile, manual transcriptions are inefficient, and waste both time and effort. As the rapid evolution of technologies, the traditional meters are gradually replaced by smart meters.

Smart meters not merely overcome drawbacks of manual transcription brought by traditional electric meters, some types of smart meters even provide information to residents such that they can analyze their behaviors of electrical power consumption and further modify their behavior so as to save energy. Furthermore, some types of smart meters are equipped with functionality for recognizing electrical equipment statuses, which may perform loading recognition according to power information provided by electrical meters, and combine environment information provided by sensors and electrical control capability provided by actuators, for designing various customized applications, and realizing smart life model in the future.

Since wireless modules need different size of antennas, in order to transmit signals in different frequency bands, such as GSM/CDMA signals, ZigBee signals, Wifi signals, and even LTE signals, traditional smart meters usually have multiple transmission devices inside, meaning that multiple antennas are needed to deal with signals in multiple frequency bands. Hence, more space is occupied by the antennas, and interference is more complicate and serious.

SUMMARY OF THE INVENTION

Therefore, an aspect of the present invention provides a smart meter capable of performing wireless transmission. An antenna of the smart meter is able to transmit and receive signals in multiple frequency bands, in addition, settling space for the antenna is reduced. Signals transmitted and received are more various.

The smart meter capable of performing wireless transmission according to an embodiment of the present invention comprises an inner cylindrical case, a ring layer, an inner-layer antenna, and an outer-layer antenna. The ring layer surrounds the inner cylindrical case. The inner-layer antenna is attached to the ring layer and slides on the ring layer. The outer-layer antenna is also attached to the ring layer, and overlaps and contacts with the inner-layer antenna. The inner-layer antenna and the outer-layer antenna are driven to adjust a total length of the inner-layer antenna and the outer-layer antenna for receiving signals of different frequency bands.

The smart meter capable of performing wireless transmission of the above embodiment not only is able to transmit and receive wireless signals via the antenna for delivering power information through networks, but also utilizes internal space to settle the antenna, reducing the space occupied by the smart meter. Furthermore, the smart meter receives signals in multiple frequency bands, and signals delivered are more various, extending the scope of applications.

These and other objectives of the present invention will no doubt become obvious to those of ordinary skill in the art after reading the following detailed description of the preferred embodiment that is illustrated in the various figures and drawings.

DETAILED DESCRIPTION

In this disclosure, terms used over all the paragraphs generally represent their plain meanings. Some special terms would be defined specifically later on, for providing more guideline for the readers. Repeatedly using one or more synonyms does not preclude the usage of other synonyms.

When a component A is described as "on some component B", it generally means that the component A is directly on the component B. It may also mean that the component A is on the component B along with other components between the component A and the component B. In contrast, when a component A is described as "directly on some component B", it means that there is no other component between the component A and the component B. In addition, relative terms such as "below", "bottom" and "above", "top" are used to describe a directional relation of one component with another component shown in figures in the description. Using the relative terms, difference between the actual directional relation and the described directional relation in the figures is understandable. For example, if an apparatus shown in a figure is overturned in reality, a component A, described as "below" some component B, is actually "above" the component B. The ordinarily used term "below" with respect to some specified position in figures may include meaning of "below" and "above". Similarly, if an apparatus shown in a figure is overturned, a component A, described as "on the bottom of" or "under" some component B, is actually "on the top of" or "over" the component B. The ordinarily used term "on the bottom of" or "under" may include meaning of "on the top of" or "over".

In antenna technology, since signal frequencies are related to lengths of antennas, wireless modules for smart meters require different sizes of antennas, in order to transmit signals indifferent frequency bands such as GSM/CDMA signals, ZigBee signals, WiFi signals, 3rd generation (3G) wireless communication signals, Industrial Scientific Medical (ISM) signals, or signals in multiple frequencies as 2.4 GHz, 1800 MHz, 900 MHz, etc. Frequency bands of these signals are different, required different lengths of antennas for transmission and reception. In addition, settling space for disposing antennas also needs to be considered. Smaller settling space for disposed antennas helps the disposition of smart meters.

Figure 1A:
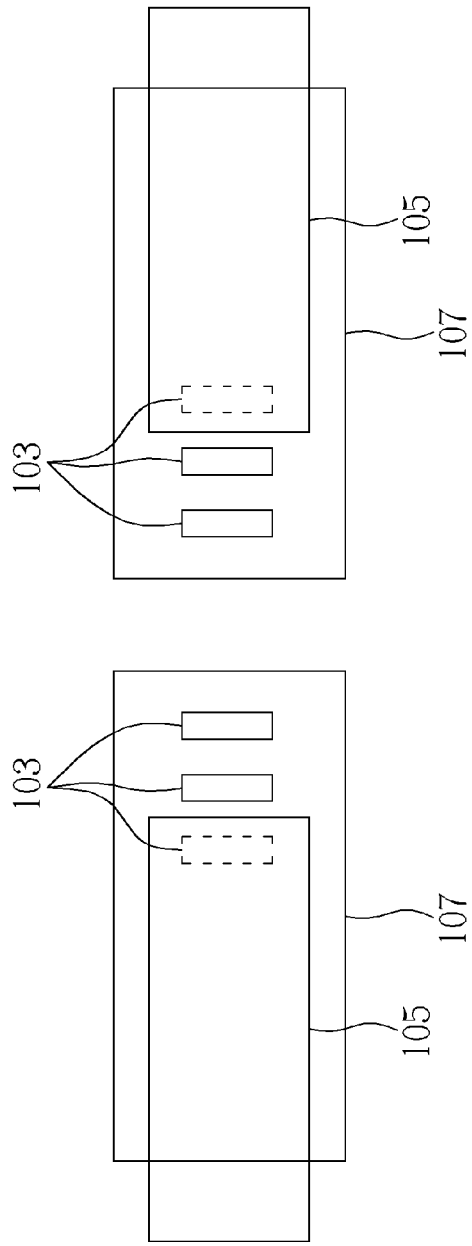
FIG. 1A is a schematic diagram of an antenna structure of a smart meter according to an embodiment of the present invention.
Figure 1B:
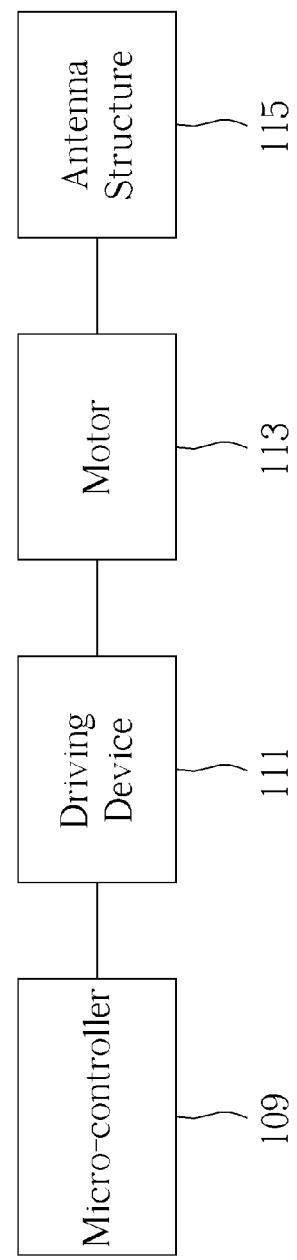
FIG. 1B is a schematic diagram of a driving mechanism of a smart meter according to an embodiment of the present invention.

FIGS. 1A and 1B are schematic diagrams of an antenna structure and a driving mechanism of a smart meter according to an embodiment of the present invention, respectively. The antenna structure of a smart meter comprises an inner-layer antenna 105 and an outer-layer antenna 107. The inner-layer antenna 105 and the outer-layer antenna 107 are made of metal material. Shapes of the inner-layer antenna 105 and the outer-layer antenna 107 mainly conform to long (or triangular) sheets, and the outer-layer antenna 107 is slightly wider than the inner-layer antenna 105. Other shapes and sizes of antennas are not precluded. A plurality of notch grooves are formed on the outer-layer antenna 107, for positioning the inner-layer antenna 105, such that the inner-layer antenna 105 slides to a pre-determined location in order to adjust a total length of the inner-layer antenna 105 and the outer-layer antenna 107. The outer-layer antenna 107 and the inner-layer antenna 105 overlap and contact with each other. In detail, the inner-layer antenna 105 and the outer-layer antenna 107 are driven so as to adjust the total length of the inner-layer antenna 105 and the outer-layer antenna 107, in order to receive signals of different frequency bands. Signal frequencies are related to total lengths of antennas as $C=F\lambda$, wherein C is the speed of light, F represents a signal frequency, and $\lambda$ represents the signal wavelength. As the total length of the antennas becomes larger, the signal transmission frequency band becomes lower; oppositely, if the total length of the antennas becomes smaller, the signal transmission frequency band becomes higher. For example, the total length of the inner-layer antenna 105 and the outer-layer antenna 107 may be adjusted to receive signals at 2.4 GHz, 1800 MHz, or 900 MHz.

The driving mechanism comprises a micro-controller 109, a driving device 111, and a motor 113. The motor 113 is controlled by the micro-controller 109 and the driving device 111, for sliding the inner-layer antenna 105 (or the outer-layer antenna 107) of an antenna structure 115, to adjust the total length of the antennas. Moreover, the micro-controller 109 may adjust an angle or other parameters of the motor via a general purpose input/output (GPIO) pin. The driver program of the micro-controller 109 may be implemented by C programming language.

According to the antenna structure and the driving mechanism, only one antenna is needed for transmitting signal in different frequency bands, instead of utilizing multiple antennas for transmitting signals of multiple frequency bands. Interferences between multiple antennas can be avoided, and the space occupied by the antennas is also reduced. In comparison to wide-band antennas, the antenna structure of the present invention avoids noise and interference caused by too wide frequency band, such that received signal quality is improved.

Figure 2A:
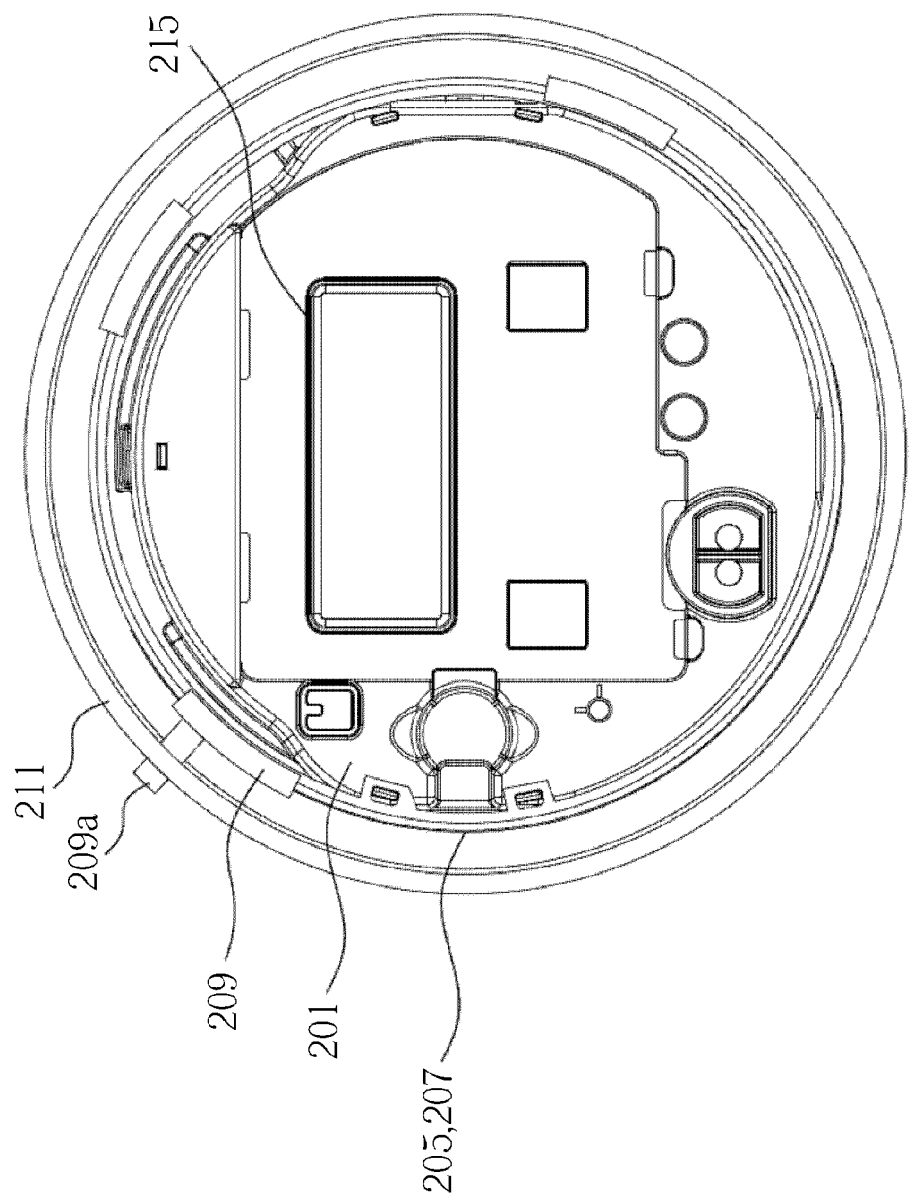
FIG. 2A is a diagram of a perspective front view of a smart meter according to another embodiment of the present invention.
Figure 2B:
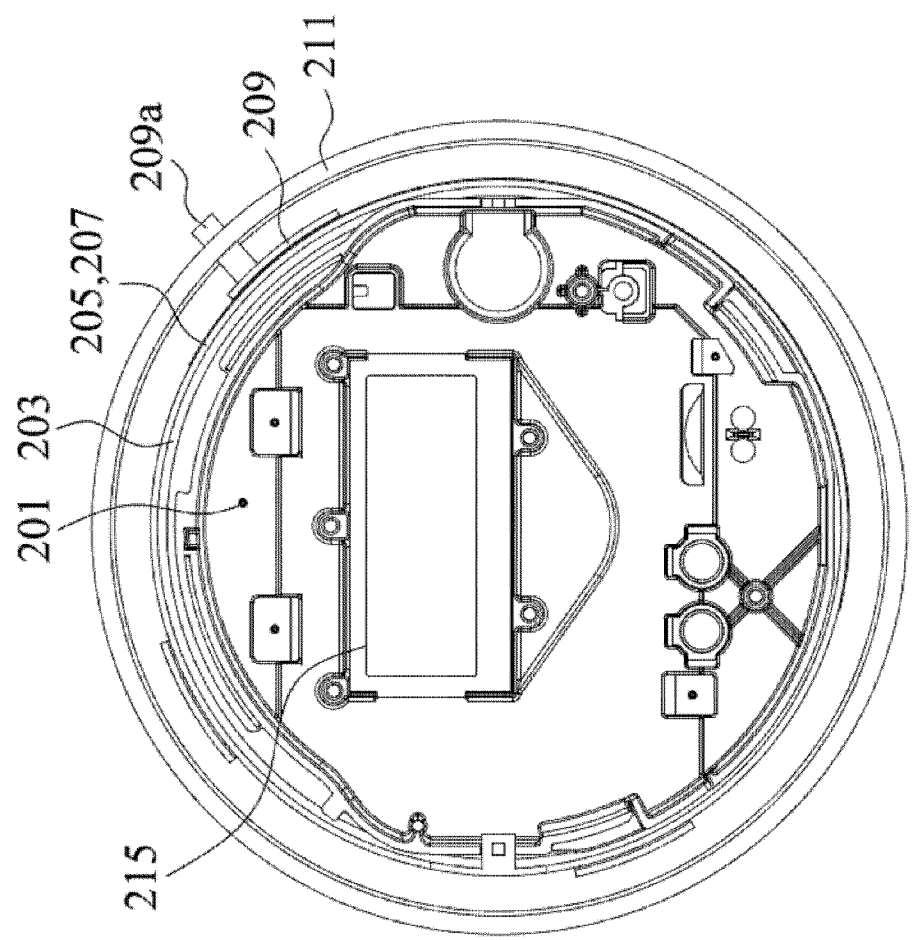
FIG. 2B is a diagram of an internal view of a smart meter according to another embodiment of the present invention.
Figure 2C:
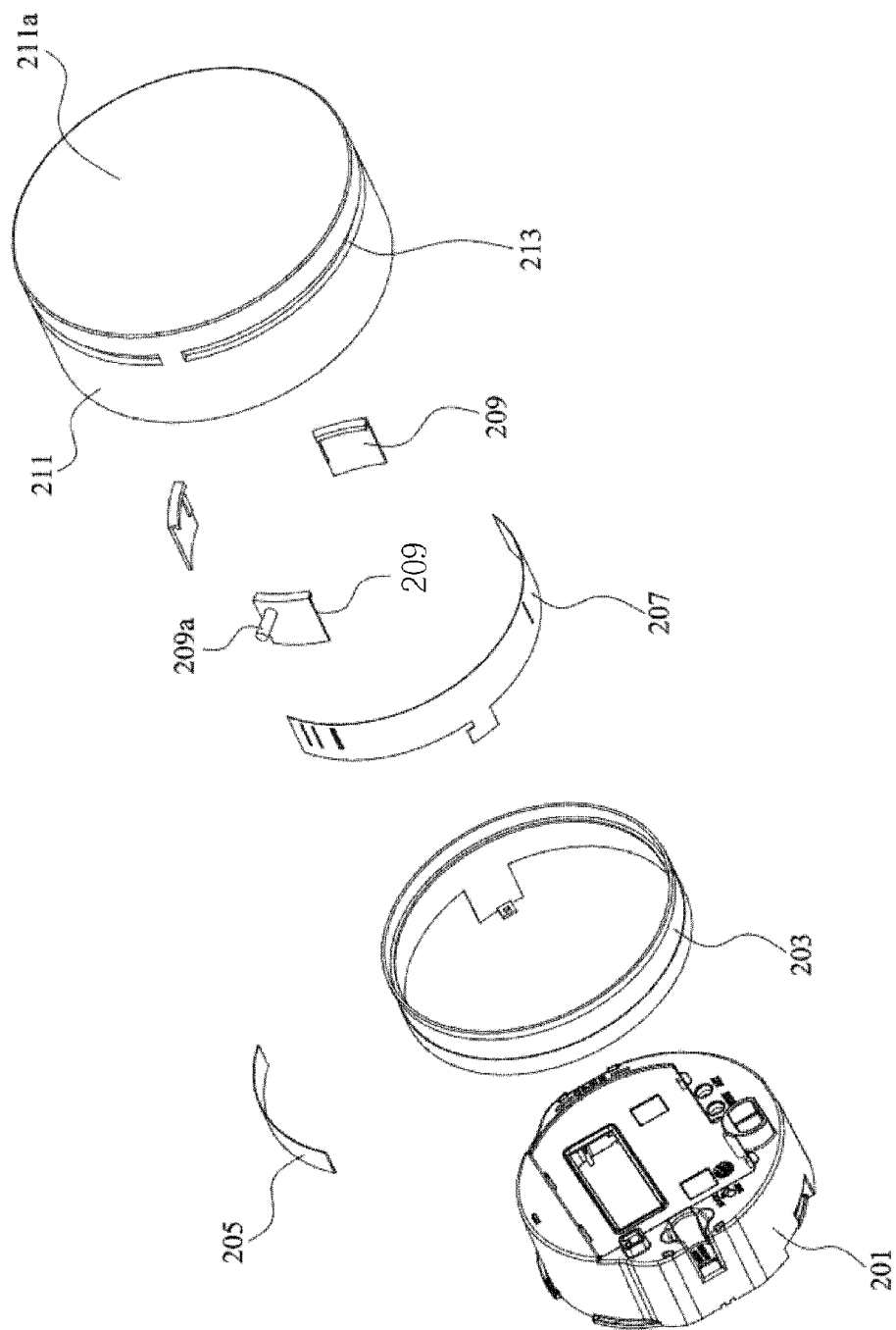
FIG. 2C is a diagram of an exploded view of a smart meter according to another embodiment of the present invention.

FIGS. 2A, 2B, 2C are diagrams of a perspective front view, an internal view, an exploded view of a smart meter according to another embodiment of the present invention, respectively. The smart meters capable of performing wireless transmission are mainly utilized for showing power information, and transmitting the power information through wireless networks. As can be seen from FIGS. 2A and 2B, from inside to outside, the smart meter comprises an inner cylindrical case 201, a ring layer 203, an inner-layer antenna 205, and an outer-layer antenna 207, wherein the inner-layer antenna 205 and the outer-layer antenna 207 overlap and contact with each other. FIG. 2C further illustrates these components from inside to outside. The inner cylindrical case 201 is hollow, such that circuit structures such as the motor, the micro-controller, and power measurement circuits can be disposed in the internal hollow space. A display region 215 is disposed on the inner cylindrical case 201, for showing the power information.

The ring layer 203 surrounds the inner cylindrical case 201. The ring layer 203 may be a slide rail. The inner-layer antenna 205 is attached to the ring layer 203, and slides on the ring layer 203. The outer-layer antenna 207 is also attached to the ring layer 203, and contacts and overlaps with the inner-layer antenna 205. The inner-layer antenna 205 and the outer-layer antenna 207 are driven by the micro-controller and the motor to adjust the total length of the inner-layer antenna 205 and the outer-layer antenna 207, in order to receive signals of different frequency bands. Herein, the outer-layer antenna 207 is fixed, and the inner-layer antenna 205 is driven by the motor to slide inside the outer-layer antenna 207. The alternative way may also be used, which is to fix the inner-layer antenna 205 and leave the outer-layer antenna 207 sliding. The inner-layer antenna 205 and the outer-layer antenna 207 are utilized for receiving 3G wireless communication signals, Zigbee signals, and ISM signals. Shapes of the inner-layer antenna 205 and the outer-layer antenna 207 mainly conform to long (or triangular) sheets, but do not preclude using other shapes.

In addition to aforementioned elements, the smart meter further comprises at least an engaging element 209 and an outer cylindrical case 211. The engaging element 209 engages the inner-layer antenna 205 and the outer-layer antenna 207. The engaging element 209 has a protrusion 209a. The outer cylindrical case 211 covers and combines the inner cylindrical case 201, the ring layer 203, the inner-layer antenna 205, the outer-layer antenna 207, and the engaging element 209. The protrusion 209a of the engaging element 209 protrudes from a groove 213 of the outer cylindrical case 211, for fixing with the outer cylindrical case 211. A top side 211a of the outer cylindrical case 211 is transparent, for perspectively showing the power information in the inner cylindrical case 201. The power information may be wattage, consumed energy in kilowatt-hours, consumed time, etc.

The smart meter in the aforementioned embodiment utilizes the build-in antenna for transmitting wireless signals to deliver power information. Power companies do not need to assign staffs to transcribe electric meters. Using smart meters not only avoids man-made errors, but also enhances efficiency by saving time and money. Using smart meters even improves safety of electrical consumption of residents, combines technology and industry, and realizes smart life model. Since the length of the antenna can be adjusted according to frequencies of transmitted and received signals. Multiple antennas are not necessary for receiving signals of multiple frequency bands. Using the antenna of the present invention avoids inter-antenna interference, improves the received signal quality, and reduces the settling space for the disposed antenna.

The aforementioned embodiments explain some practical details. However, it should be understood that the practical details should not limit the scope of the present invention. In other words, in part of the embodiment in the present invention, the practical details are not necessary. In addition, for the brevity of figures, some structures and elements known in the art are illustrated simply and schematically in the figures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A smart meter capable of performing wireless transmission over a plurality of frequency bands, for showing power information, the smart meter comprising:
    an inner cylindrical case;
    a ring layer, surrounding the inner cylindrical case;
    an inner-layer antenna, attached to the ring layer, and sliding on the ring layer;
    an outer-layer antenna, attached to the ring layer, and overlapping and contacting with the inner-layer antenna;
    an engaging element, for engaging the inner-layer antenna and the outer-layer antenna; and
    an outer cylindrical case, covering and combining the inner cylindrical case, the ring layer, the inner-layer antenna, the outer-layer antenna, and the engaging element, wherein a protrusion of the engaging element protrudes from a groove of the outer cylindrical case, for fixing with the outer cylindrical case;
    wherein the smart meter selectively operates at a first frequency band of the plurality of frequency bands by driving the inner-layer antenna or the outer-layer antenna to adjust a total length of the inner-layer antenna and the outer-layer antenna;
    wherein a display region is disposed on the inner cylindrical case, for perspectively showing the power information.

2. The smart meter of claim 1, further comprising:
    a micro-controller; and
    a motor, controlled by the micro-controller to slide the inner-layer antenna or the outer-layer antenna.

3. The smart meter of claim 2, wherein the outer-layer antenna is fixed, and the inner-layer antenna is driven by the motor and slides inside the outer-layer antenna.

4. The smart meter of claim 1, wherein a plurality of notch grooves are formed on the outer-layer antenna, for positioning the inner-layer antenna, such that the inner-layer antenna slides to a pre-determined location.

5. The smart meter of claim 1, wherein the inner-layer antenna and the outer-layer antenna receive 3rd generation (3G) wireless communication signals, Zigbee signals, and Industrial Scientific Medical (ISM) signals.

6. The smart meter of claim 1, wherein shapes of the inner-layer antenna and the outer-layer antenna conform to long sheets.

7. The smart meter of claim 1, wherein a top side of the outer cylindrical case is transparent, for perspectively showing the power information in the inner cylindrical case.

* * * * *